United States Patent
Qiu (10) Patent No.: US 12,265,104 B2
(45) Date of Patent: Apr. 1, 2025

(54) VOLTAGE DETECTION CIRCUIT AND VOLTAGE DETECTION METHOD

(71) Applicant: CHANGXIN MEMORY TECHNOLOGIES, INC., Hefei (CN)

(72) Inventor: Anping Qiu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 126 days.

(21) Appl. No.: 18/186,945

(22) Filed: Mar. 20, 2023

(65) Prior Publication Data

US 2023/0408557 A1    Dec. 21, 2023

Related U.S. Application Data

(63) Continuation of application No. PCT/CN2022/102957, filed on Jun. 30, 2022.

(30) Foreign Application Priority Data

Jun. 17, 2022    (CN) .......................... 202210693435.3

(51) Int. Cl.
  *G01R 19/165*    (2006.01)
(52) U.S. Cl.
  CPC ............................. *G01R 19/16576* (2013.01)
(58) Field of Classification Search
  CPC .......... G01R 19/16576; G01R 31/3835; G01R 31/40; G01R 19/16504; G05F 1/575
  See application file for complete search history.

(56) References Cited

U.S. PATENT DOCUMENTS

| 6,166,566 | A  | 12/2000 | Strong |
| 9,746,501 | B1 | 8/2017  | Chang  |

| 2022/0203864 | A1* | 6/2022  | Kong ............... G01R 19/16504 |
| 2023/0409062 | A1* | 12/2023 | Abbasi ..................... G05F 1/575 |
| 2024/0015412 | A1* | 1/2024  | Tsuchimoto ........... H04N 25/78 |
| 2024/0223069 | A1* | 7/2024  | Lin .......................... H02M 1/32 |

FOREIGN PATENT DOCUMENTS

| CN | 101500358  | A | 8/2009  |
| CN | 102075168  | A | 5/2011  |
| CN | 103618522  | A | 3/2014  |
| CN | 103105882  | B | 12/2016 |
| JP | 2003163582 | A | 6/2003  |

OTHER PUBLICATIONS

International Search Report in the international application No. PCT/CN2022/102957, mailed on Mar. 9, 2023.

* cited by examiner

*Primary Examiner* — Akm Zakaria (74) *Attorney, Agent, or Firm* — Syncoda LLC; Feng Ma (57) ABSTRACT

A voltage detection circuit including a threshold setting module and a voltage conversion module, and a voltage detection method are provided. In the threshold setting module, a first input end is configured to receive a voltage to be detected, a second input end is configured to receive a threshold regulation signal, a power supply end is connected to a first voltage and is configured to set a voltage regulation range according to the threshold regulation signal, determine a first voltage regulation value in the voltage regulation range according to the voltage to be detected, and generate a control voltage according to the first voltage and the first voltage regulation value. The voltage conversion module is configured to output a first level when the control voltage is greater than a preset value and output a second level when the control voltage is less than or equal to the preset value.

18 Claims, 8 Drawing Sheets

VOLTAGE DETECTION CIRCUIT AND VOLTAGE DETECTION METHOD

CROSS-REFERENCE TO RELATED APPLICATIONS

This is a continuation of International Patent Application No. PCT/CN2022102957 filed on Jun. 30, 2022, which claims priority to Chinese Patent Application No. 202210693435.3 filed on Jun. 17, 2022. The disclosures of the above-referenced applications are hereby incorporated by reference in their entirety.

BACKGROUND

A voltage detection circuit is a common functional circuit in circuit design, for determining whether the voltage reaches a target value after a detection threshold is set. When the process is unstable or a device changes, the detection threshold also changes accordingly. But the voltage detection circuit in some implementations usually has a fixed threshold, the threshold cannot be regulated. Therefore, an important requirement in this field is to develop a voltage detection circuit which can regulate the threshold.

It is to be noted that the information disclosed in the above background part is used only to enhance the understanding of the background part of the present disclosure, and thus may include information in the conventional art not constituting known to those of ordinary skill in the art.

SUMMARY

The present disclosure relates to the technical field of electronic circuits, and in particular to a voltage detection circuit and a voltage detection method, to flexibly regulate a voltage detection threshold, so as to overcome, at least to a certain extent, a problem that a voltage detection threshold of the voltage detection circuit cannot be regulated flexibly due to the limitations and defects of some implementations.

A first aspect of the present disclosure provides a voltage detection circuit, which includes a threshold setting module and a voltage conversion module. The threshold setting module has a first input end, a second input end and a power supply end. The first input end is configured to receive a voltage to be detected, the second input end is configured to receive a threshold regulation signal, the power supply end is connected to a first voltage, and is configured to set a voltage regulation range according to the threshold regulation signal, determine a first voltage regulation value in the voltage regulation range according to the voltage to be detected, and generate a control voltage according to the first voltage and the first voltage regulation value. An input end of the voltage conversion module receives the control voltage through a first node, and is configured to output a first level in response to that the control voltage is greater than a preset value and output a second level in response to that the control voltage is less than or equal to the preset value.

A second aspect of the present disclosure provides a voltage detection method applied to the voltage detection circuit described above. The voltage detection method includes the following operations. A threshold regulation signal is outputted to set a voltage regulation range. A first voltage regulation value is determined within the voltage regulation range according to a voltage to be detected. A control voltage is determined according to the first voltage regulation value and a first voltage. The control voltage is detected, a first level is outputted in response to that the control voltage is greater than a preset value, and a second level is outputted in response to that the control voltage is less than or equal to the preset value.

It is to be understood that the above general descriptions and detailed descriptions below are only exemplary and explanatory and not intended to limit the disclosure.

BRIEF DESCRIPTION OF THE DRAWINGS

The accompanying drawings, which are incorporated in and constitute a part of this specification, illustrate embodiments consistent with the present disclosure and, together with the description, serve to explain the principles of the present disclosure. Apparently, the accompanying drawings in the following description are only some embodiments of the present disclosure, for those of ordinary skill in the art, some other accompanying drawings may also be obtained according to these accompanying drawings on the premise of not contributing creative effort.

DETAILED DESCRIPTION

Exemplary implementations are described more comprehensively with reference to the accompanying drawings. However, the exemplary implementations can be implemented in many forms and should not be understood to be limited to the examples described here. On the contrary, these implementations are provided to make the present disclosure more comprehensive and complete, and fully communicate the concept of the exemplary implementations to those skilled in the art. The described characteristics, structures or features can be combined in one or more implementations in any proper way. In the following descriptions, many specific details are provided to give a full understanding of the implementations of the present disclosure. However, those skilled in the art will appreciate that the technical solution of the disclosure may be practiced while omitting one or more of the specific details, or other methods, components, apparatuses steps, etc. may be employed. In other cases, the well-known technical solutions are not shown or described in detail, so as to avoid obscuring various aspects of the disclosure.

In addition, the accompanying drawings are merely schematic illustrations of the present disclosure. The same reference signs in the drawings denote the same or similar parts, and thus are not repeatedly described. Some block diagrams shown in the drawings are functional entities and do not necessarily have to correspond to physically separate entities. These functional entities may be implemented in software, or these functional entities may be implemented in one or more hardware modules or integrated circuits, or these functional entities are implemented in different networks and/or processor apparatuses and/or micro-controller apparatuses.

The exemplary implementations of the present disclosure are elaborated below in combination with the accompanying drawings.

Figure 1:
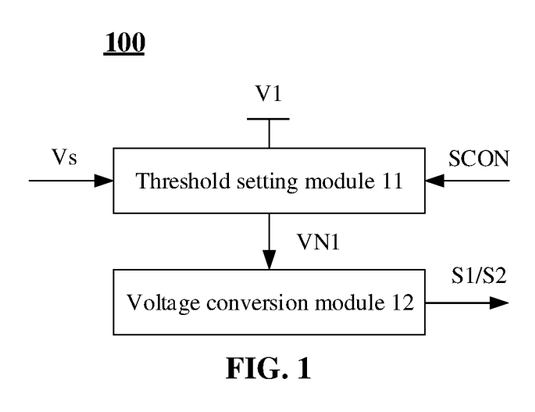
FIG. 1 is a schematic structural diagram of a voltage detection circuit in an exemplary embodiment of the present disclosure.

FIG. 1 is a schematic structural diagram of a voltage detection circuit in an exemplary embodiment of the present disclosure.

Referring to FIG. 1, the voltage detection circuit 100 may include a threshold setting module 11 and a voltage conversion module 12.

The threshold setting module 11 has a first input end, a second input end and a power supply end. The first input end is configured to receive a voltage Vs to be detected, the second input end is configured to receive a threshold regulation signal SCON, and the power supply end is connected to a first voltage V1, and is configured to set a voltage regulation range according to the threshold regulation signal SCON, determine a first voltage regulation value $\Delta V1$ in the voltage regulation range according to the voltage Vs to be detected, and generate a control voltage VN1 according to the first voltage V1 and the first voltage regulation value $\Delta V1$.

An input end of the voltage conversion module 12 receives the control voltage VN1 through a first node N1 (referring to FIG. 7), and is configured to output a first level S1 when the control voltage VN1 is greater than a preset value and output a second level S2 when the control voltage VN1 is less than or equal to the preset value.

In an embodiment of the present disclosure, the threshold setting module 11 has a plurality of predetermined voltage regulation ranges. The threshold regulation signal SCON is configured to select one from the plurality of voltage regulation ranges as a target voltage regulation range (including the maximum regulation voltage and the minimum regulation voltage and voltages between the maximum regulation voltage and the minimum regulation voltage). The first voltage regulation value $\Delta V1$ is set within the target voltage regulation range based on the voltage Vs to be detected, and the voltage of the first node N1 is regulated based on the first voltage regulation value $\Delta V1$, so that the threshold setting module 11 outputs the regulated control voltage VN1.

When the voltage Vs to be detected changes, the first voltage regulation value $\Delta V1$ outputted based on the voltage Vs to be detected changes, and the control voltage VN1 changes, and the voltage conversion module 12 outputs the first level S1 or the second level S2 based on the changing control voltage VN1.

Multiple optional voltage regulation ranges are set, and the first voltage regulation value $\Delta V1$ is determined in the selected target voltage regulation range according to the voltage Vs to be detected. Therefore, the voltage regulation range can be selected through the threshold regulation signal SCON at any time. When the voltage Vs to be detected changes, a change range and amplitude of the control voltage VN1 is kept unchanged. Therefore, a detection threshold of the voltage Vs to be detected can be changed without modifying the detection threshold of the voltage conversion module 12. The analysis is given as follows.

When the detection threshold of the voltage Vs to be detected is to be increased, the voltage conversion module 12 performs voltage turnover only when the voltage Vs to be detected is high. However, since a turnover condition of the voltage conversion module 12 is unchanged, the control voltage VN1 during the turnover is unchanged. Also, since the first voltage V1 based on which the control voltage VN1 is generated is unchanged, the first voltage regulation value $\Delta V1$ is unchanged correspondingly. That is, in order to increase the detection threshold of the voltage Vs to be detected, the detection threshold should be increased based on the voltage Vs to be detected corresponding to the first voltage regulation value $\Delta V1$. In this condition, when the voltage Vs to be detected does not increase to the detection threshold, the first voltage regulation value $\Delta V1$ cannot reach a first voltage regulation value $\Delta V1$ corresponding to the level turnover of the voltage conversion module 12, and the first voltage regulation value $\Delta V1$ is set in the target voltage regulation range by the voltage Vs to be detected, and the first voltage regulation value $\Delta V1$ changes with the change of either one of the voltage Vs to be detected or the target voltage regulation range. Therefore, the target voltage regulation range is required to be regulated when the detection threshold of the voltage Vs to be detected is increased.

When the first voltage regulation value $\Delta V1$ is positively correlated with the voltage Vs to be detected, the target voltage regulation range is reselected to reduce the maximum regulation voltage and the minimum regulation voltage in the target voltage regulation range, and further the first voltage regulation value $\Delta V1$ maintains unchanged when the voltage Vs to be detected increases. When the first voltage regulation value $\Delta V1$ is inversely proportional to the voltage Vs to be detected, the target voltage regulation range is reselected to increase the maximum regulation voltage and the minimum regulation voltage in the target voltage regulation range, and the first voltage regulation value $\Delta V1$ maintains unchanged when the voltage Vs to be detected increases.

Accordingly, when the detection threshold of the voltage Vs to be detected is to be reduced, the voltage conversion module 12 performs voltage turnover only when the voltage Vs to be detected is low. As analyzed above, when the voltage Vs to be detected does not decrease to the detection threshold, the first voltage regulation value $\Delta V1$ cannot reach the first voltage regulation value $\Delta V1$ corresponding to the level turnover of the voltage conversion module 12, while the first voltage regulation value $\Delta V1$ is set in the target voltage regulation range by the voltage Vs to be detected. Therefore, the target voltage regulation range is required to be regulated when the detection threshold of the voltage Vs to be detected is reduced.

When the first voltage regulation value $\Delta V1$ is directly proportional to the voltage Vs to be detected, the target voltage regulation range is reselected to increase the maximum regulation voltage and the minimum regulation voltage in the target voltage regulation range, and further the first voltage regulation value $\Delta V1$ maintains unchanged when the voltage Vs to be detected decreases. When the first voltage regulation value $\Delta V1$ is inversely proportional to the voltage Vs to be detected, the target voltage regulation range is reselected to reduce the maximum regulation voltage and the minimum regulation voltage in the target voltage regulation range and further the first voltage regulation value $\Delta V1$ maintains unchanged when the voltage Vs to be detected decreases.

Therefore, the voltage detection circuit provided by the embodiments of the present disclosure can flexibly regulate the detection threshold of the voltage Vs to be detected through the threshold regulation signal SCON, and can be applied in circuits of a variety of environments and a variety of detection requirements, thereby achieving efficient voltage detection.

Multiple embodiments of the voltage detection circuit are introduced below.

Figure 2:
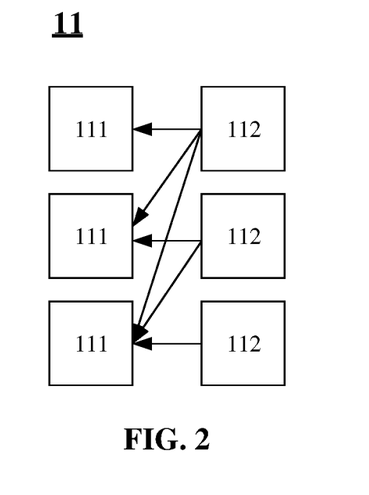
FIG. 2 is a schematic diagram of a threshold setting module in an embodiment of the present disclosure.

FIG. 2 is a schematic diagram of a threshold setting module in an embodiment of the present disclosure.

Referring to FIG. 2, in an exemplary embodiment of the present disclosure, the threshold setting module 11 includes a plurality of threshold setting units 111 and a plurality of control units 112. Each of the control units 112 is connected to one or more of the threshold setting units 111, and each of the control units 112 is configured to enable one or more threshold setting units 111 corresponding to the control unit in response to the threshold regulation signal SCON. The number and the connection relationship of the threshold setting units 111 and the control units 112 are exemplified in FIG. 2. In practical applications, the number and the connection relationship of the threshold setting units 111 and the control units 112 may be flexibly set according to threshold setting requirements. It is to be noted that this adjustable number and connection relationship are not fixed in advance, but can be switched through the control signal.

The voltage regulation ranges corresponding to the plurality of threshold setting units 111 are identical, or the voltage regulation range of at least one threshold setting unit 111 is different from the voltage regulation range of the other threshold setting units 111. When the voltage regulation ranges corresponding to a plurality of threshold setting units 111 are identical, the voltage regulation range may be set by regulating the number of enabled threshold setting units 111. The control logic is simple and efficient. When the voltage regulation range of at least one threshold setting unit 111 is different from the voltage regulation ranges of other threshold setting units, the number of voltage regulation ranges is greater than the number of threshold setting units 111 by combining the threshold setting units 111 having different voltage regulation ranges. Therefore, the richness of threshold regulation schemes can be improved.

In an embodiment of the present disclosure, each control unit 112 is connected to one or more threshold setting units 111. In this way, the voltage regulation range that the control unit 112 can select may be expanded, to achieve the voltage regulation range that cannot be achieved by one threshold setting unit 111. When the number of control units 112 is greater than one, at least two control units 112 are connected to the same threshold setting unit 111, or different control units 112 are connected to different threshold setting units 111. When different control units 112 are connected to different threshold setting units 111, the control units 112 have fixed correspondences with the threshold setting units 111. Therefore, the control logic is relatively simple, and it is easy to troubleshoot. When two or more control units 112 are connected to the same threshold setting unit 111, a great number of voltage regulation ranges may be achieved by a small number of threshold setting units. As shown in FIG. 2, when the voltage regulation ranges of three threshold setting units 111 are different from each other, a scheme of setting up to seven voltage regulation ranges can be implemented if different control units 112 are allowed to jointly control one threshold setting unit 111.

In addition, a control end of the control unit 112 may be configured to receive the threshold regulation signal or an inversion signal of the threshold regulation signal. Alternatively, the threshold regulation signal includes a plurality of different threshold regulation sub-signals, and the control end of each control unit 112 corresponds to one of the threshold regulation sub-signals, and different control units 112 are connected to the same threshold regulation sub-signal or different threshold regulation sub-signals.

In an embodiment, when the control units 112 are enabled, the control unit 112 may be divided into two groups, each of which includes one or more control units 112. One group of control units is used for receiving the threshold regulation signal, and the other group of control units is used for receiving the inversion signal of the threshold regulation signal. The inversion signal of the threshold regulation signal is, for example, a signal obtained by processing the threshold regulation signal through a component or a combination of components with a signal inverting function. The components with the signal inverting function include, but are not limited to, an inverter, an NAND gate, an NOR gate and a combination of multiple components. In this case, when one group of control units 112 is enabled, the other group of control units 112 stops working, to implement two voltage regulation ranges. It is understandable that when performing different enabling controls, the control units 112 are grouped differently to obtain corresponding signal regulation ranges.

The number of control units 112 in each group may be one or more. When the number of control units 112 in each group is more than one, the scheme of enabling one group of control units 112 at the same time may expand the maximum range of the voltage regulation range, to achieve the voltage regulation range that cannot be achieved by one control unit 112 connected to multiple threshold setting units 111. For example, due to the limitation of drive capability and other factors, one control unit 112 is connected to x threshold setting units 111 at maximum, and each threshold setting unit 111 achieves at most y voltage regulation ranges. If the required voltage regulation range is greater than x*y, a group of control units 112 should be enabled at the same time to achieve a larger voltage regulation range.

In another embodiment, the threshold regulation signal may include multiple threshold regulation sub-signals independent of one another, a control end of each control unit 112 corresponds to one threshold regulation sub-signal, and different control units 112 are connected to the same or different threshold regulation sub-signals. The multiple control units 112 are controlled through multiple threshold regulation sub-signals, thereby increasing the number of control schemes, and increasing the optional number of voltage regulation ranges. Therefore, a large number of voltage regulation ranges can be achieved using a small number of threshold setting units 111 and control units 112.

The control unit 112 may achieve the function in a variety of ways, which include but is not limited to: outputting an enabling signal through the control unit 112, and short-circuiting one or more threshold setting units 111 through the control unit 112, etc.

Figure 3:
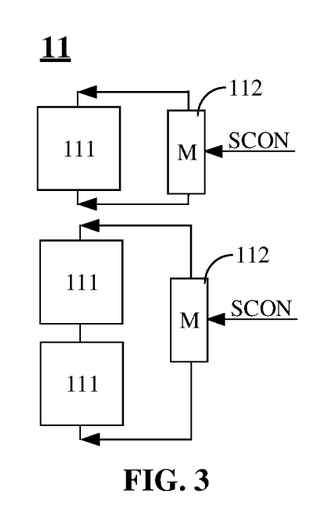
FIG. 3 is a schematic diagram of a control unit in an embodiment of the present disclosure.

FIG. 3 is a schematic diagram of a control unit in an embodiment of the present disclosure. The embodiment shown in FIG. 3 can be applied in any connection way described above.

Referring to FIG. 3, in an exemplary embodiment of the present disclosure, the control unit 112 includes a switch element M. A first end of the switch element M is connected to a first end of the threshold setting unit 111 corresponding to the switch element M, and the second end of the switch element M is connected to a second end of the corresponding threshold setting unit 111. For example, the switch element may be implemented by a transistor.

The way shown in FIG. 3 is to disable the threshold setting unit 111 by short-circuiting the control unit 112 corresponding to the threshold setting unit. The implementation of components of such the control mode is relatively simple. There is no need to set a circuit in the control unit 112, but only a controllable switch element (for example, a transistor) is needed to implement the components. It should be mentioned that no matter whether multiple threshold setting units 111 are connected in series, in parallel or independent with each other, the multiple threshold setting units 111 can be applicable to the control mode shown in FIG. 3.

In practical, in addition to short-circuiting, the threshold setting unit 111 may also be enabled and work by other ways of outputting the enabling signal, which is not limited by the present disclosure.

Figure 4:
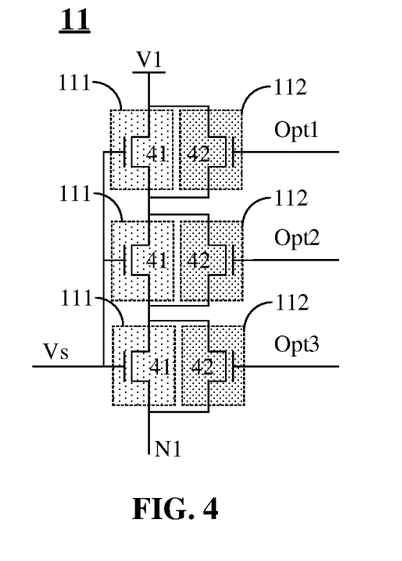
FIG. 4 is a schematic diagram of a threshold setting module and a control unit in an embodiment of the present disclosure.

FIG. 4 is a schematic diagram of a threshold setting module and a control unit in an embodiment of the present disclosure.

Referring to FIG. 4, in an exemplary embodiment of the present disclosure, each threshold setting unit 111 includes one or more transistors connected in series. The threshold setting module 11 includes M transistors 41 connected in series.

The gates of the M transistors 41 are all coupled to the first input end. A first end of the first transistor 41 in the M transistors is coupled to a power supply end, a second end of the first transistor 41 is connected to a first end of the second transistor 41 in the M transistors, a second end of the M-th transistor 41 in the M transistors is connected to a first node N1, and a first end of the M-th transistor 41 is connected to a second end of the (M-1)-th transistor in the M transistors, M being greater than or equal to 2.

In the embodiment shown in FIG. 4, for simplifying the example, M is equal to 3. Each threshold setting unit 111 has one first N-type transistor 41, and a control end (i.e., the gate) of the first N-type transistor 41 is connected to a first input end of the threshold setting module 11 to receive the voltage Vs to be detected. Each threshold setting unit 111 corresponds to a control unit 112. The control unit 112 is implemented by a second N-type transistor 42. A control end of each second N-type transistor 42 is connected to a threshold regulating sub-signal Opti, i being a natural number greater than or equal to 1.

As shown in FIG. 4, a turning-on degree of the first N-type transistor 41 is affected by the voltage Vs to be detected. Therefore, different voltages Vs to be detected enable the first N-type transistor 41 to have different forward voltage drops Vth. If x first N-type transistors 41 of the first N-type transistors 41 connected in series are enabled (the second N-type transistors 42 corresponding to the x first N-type transistors 41 are not turned on to short circuit the second N-type transistors 42), a serial voltage drop x*Vth is formed. The serial forward voltage drop X*Vth is the first voltage regulation value ΔV1, x being a natural number. Thus, the control voltage VN1 of the first node N1 is:

$$VN1 = V1 - x*Vth \quad (1).$$

If a conducting current I is controlled to be constant through an additional connected circuit, a voltage regulation range of each threshold setting unit 111 ranges from 0 to Vthmax, where 0 corresponds to the case where the internal resistance of the first N-type transistor 41 is zero when the first N-type transistor 41 is completely turned on (since an MOS transistor 41 is an NMOS transistor, when V1 is a high level, the minimum voltage drop of the first N-type transistor 41 should be a threshold voltage of the NMOS transistor), and Vthmax is a voltage drop caused when the first N-type transistor 41 is turned off. The voltage regulation range enlarges with an increase of the number of threshold setting units 111 which are enabled. When x threshold setting units 111 are enabled, the voltage regulation range ranges from 0 to x*Vthmax. When the conducting current is not constant, the voltage regulation range corresponding to each threshold setting unit 11 may be analyzed according to the Ohm's law and the external circuit connected to the first node N1.

The threshold setting module 11 is implemented through the transistors connected in series, and the advantages of small layout area, small number of components, simple circuit structure, etc. can be realized, thereby implementing the voltage detection circuit with a threshold regulation function without occupying more layout area.

Figure 5:
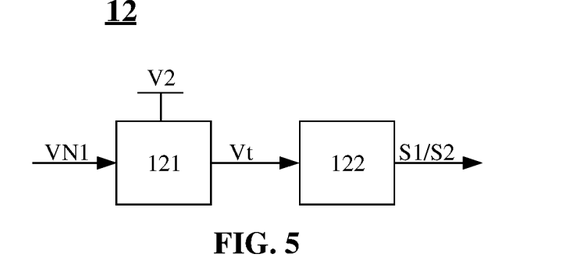
FIG. 5 is a schematic diagram of a voltage conversion module in an embodiment of the present disclosure.

FIG. 5 is a schematic diagram of a voltage conversion module in an embodiment of the present disclosure.

Referring to FIG. 5, in an exemplary embodiment of the present disclosure, the voltage conversion module 12 includes a detection unit 121 and a level conversion unit 122.

The detection unit 121 has a power end, an input end and an output end. The power end is connected to a second voltage V2, and the input end is connected to the first node N1. The detection unit 121 is configured to determine a second voltage regulation value ΔV2 according to the control voltage VN1 of the first node N1, and output a detection voltage Vt through the output end according to the second voltage V2 and the second voltage regulation value ΔV2.

An input end of the level conversion unit 122 is connected to the output end of the detection unit 121, and is configured to output a first level S1 or a second level S2 according to the detection voltage Vt.

Depending on the setting, the first level Si may be either high level (logic "1") or low level (logic "0"), and correspondingly, the second level S2 may be either low level (logic "0") or high level (logic "1").

By determining the second voltage regulation value ΔV2 according to the control voltage VN1 and outputting the detection voltage Vt through the output end according to the second voltage V2 and the second voltage regulation value ΔV2, the control voltage VN1 and the detection voltage Vt can be isolated, so that the fluctuation and regulation of the control voltage VN1 are smoothly reflected to the input end of the level conversion unit 122; and the requirements of the level conversion unit 122 for an input level can be matched through the second voltage V2, so that the detection voltage Vt can not only reflect a change trend of the control voltage VN1, but also adapt to the performance of the level conversion unit, such as the turnover level, thereby reducing a level limit on the control voltage VN1.

The level conversion unit 122 may be any component or combination of components having an analog/digital conversion function. The level conversion unit 122 performs threshold determination on continuously changing detection voltage Vt, to output a digital level, which constitutes a digital pulse signal consisting of the first level S1 and the second level S2, and a voltage detection result is outputted to an external processor or a device which receives the voltage detection result.

The detection unit 121 and the level conversion unit 122 may be implemented by a variety of circuits.

Figure 6:
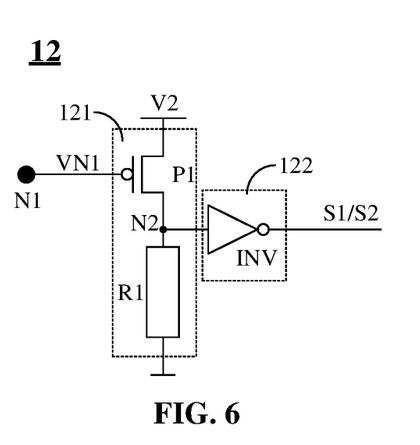
FIG. 6 is a circuit diagram of a voltage conversion module in an embodiment of the present disclosure.

FIG. 6 is a circuit diagram of a voltage conversion module in an embodiment of the present disclosure.

Referring to FIG. 6, in an embodiment, the detection unit 121 may include: a first P-type transistor P1 and a first resistance unit R1.

The gate of the first P-type transistor P1 as the input end of the voltage conversion module 12 is connected to the first node N1, the source of the first P-type transistor P1 is connected to a power end, and the drain of the first P-type transistor P1 is connected to a second node N2. The second node N2 is connected to an input end of the level conversion unit 122.

A first end of the first resistance unit R1 is connected to the second node N2, and the second end of the first resistance unit R1 is grounded.

The level conversion unit 122 includes an inverter INV.

The first resistance unit R1 may be implemented by means of one or more resistors connected in series or in parallel, or other electronic components having resistance property, which is not limited by the present disclosure.

The circuit shown in FIG. 6 realizes the function of the voltage conversion module 12 through the simplified components, and can directly output a voltage detection result, that is the first level Si or the second level S2, according to the control voltage VN1, to convert the analog voltage to a digital pulse. In the embodiment shown in FIG. 6, the first level Si is a high level (logic "1") and the second level S2 is a low level (logic "0").

Figure 7:
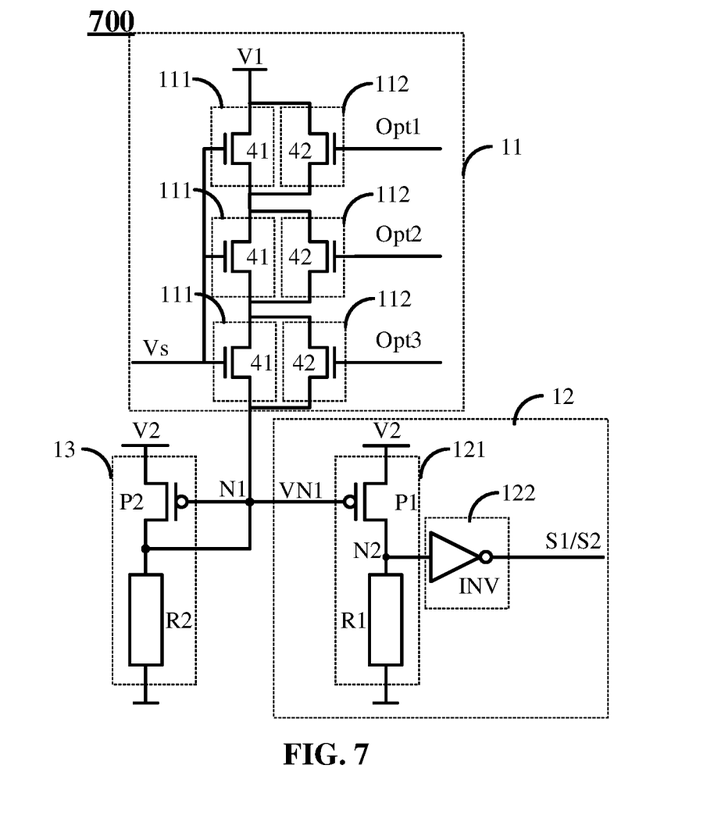
FIG. 7 is a circuit diagram of a voltage detection circuit in an embodiment of the present disclosure.

FIG. 7 is a circuit diagram of a voltage detection circuit in an embodiment of the present disclosure.

Referring to FIG. 7, in an exemplary embodiment of the present disclosure, the voltage detection circuit 700 may also include a voltage bias module 13. The voltage bias module 13 is connected to the first node N1, and is configured to provide a bias voltage Vref for the input end of the voltage conversion module 12.

In the embodiment shown in FIG. 7, the voltage bias module 13 may include: a second P-type transistor P2 and a second resistance unit R2.

The source of the second P-type transistor P2 is connected to a second voltage V2, and the gate and the drain of the second P-type transistor P2 are connected to the first node N1.

A first end of the second resistance unit R2 is connected to the first node N1, and the second end of the second resistance unit R2 is grounded.

The second resistance unit R2 may be implemented by means of one or more resistors connected in series or in parallel, or other electronic components with resistance property, which is not limited by the present disclosure.

In an embodiment, the voltage bias module 13 is further configured to provide the bias voltage for the first node N1, to ensure that the first node N1 is in a low-level steady state when the power supply end is disconnected from the first node N1. In the embodiment shown in FIG. 7, the voltage bias module 13 may further be configured to discharge a current of the threshold setting module 11 to keep the current of the first node N1 stable.

By overall analyzing the voltage detection circuit 700, when the voltage Vs to be detected raises above a threshold from a low voltage, an output signal of the inverter INV changes to the first level S1, that is, the high level (logic "1").

The working principle is analyzed as follows.

When the voltage Vs to be detected is a low voltage, an internal resistance of the first N-type transistor N1 is high, the forward voltage drop Vth is large, and the control voltage VN1 is low, the first node N1 is biased at Vp0, and the second node N2 is biased at Vm1, so that an output signal of the inverter INV is a second level S2, that is, the low level (logic "0").

When the voltage Vs to be detected increases, an internal resistance of the first N-type transistor N1 decreases, and the forward voltage drop Vth decreases, the control voltage VN1 also increases according to the formula (1), the first P-type transistor P1 gradually turns off, and the detection voltage Vt tends to the low level, that is, logic "0". When the voltage of the detection voltage Vt is lower than the turnover level of the inverter INV, the output signal of the inverter INV becomes the first level S1, that is, the high level (logic "1"), indicating that the voltage Vs to be detected exceeds the threshold.

The voltage detection circuit provided by the embodiments of the present disclosure can flexibly regulate the voltage detection threshold through a small number of components, and can directly output a detection result about whether the voltage Vs to be detected conforms to the detection threshold. The voltage detection circuit occupies a small size of the circuit layout, and has powerful functions.

Figure 8:
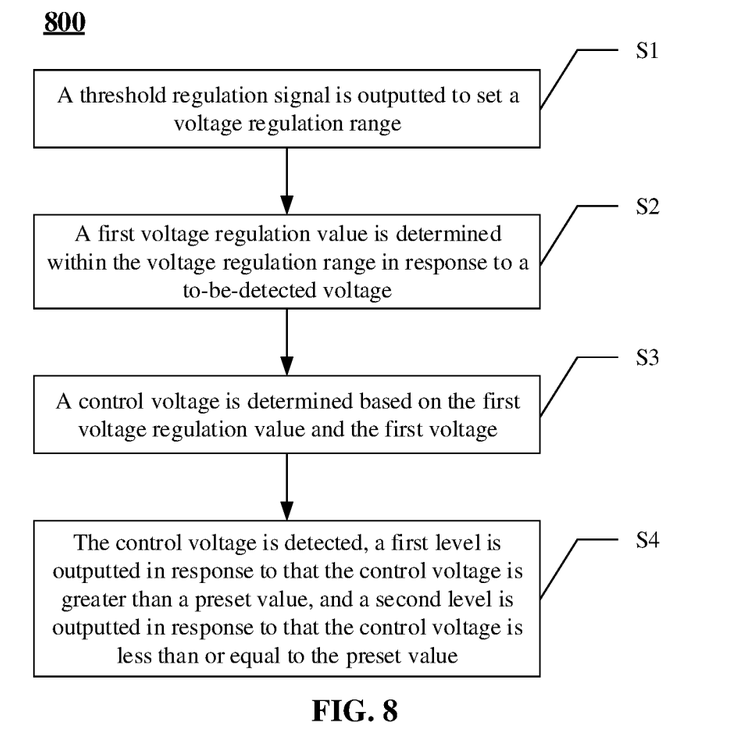
FIG. 8 is a flowchart of a voltage detection method in an embodiment of the present disclosure.

FIG. 8 is a flowchart of a voltage detection method in an embodiment of the present disclosure. The method shown in FIG. 8 can be applied to the voltage detection circuit of any of the above embodiments.

Referring to FIG. 8, the voltage detection method 800 may include the following operations.

At S1, a threshold regulation signal is outputted to set a voltage regulation range.

At S2, a first voltage regulation value is determined within the voltage regulation range according to a voltage to be detected.

At S3, a control voltage is determined according to the first voltage regulation value and a first voltage.

At S4, the control voltage is detected, a first level is outputted when the control voltage is greater than a preset value, and a second level is outputted when the control voltage is less than or equal to the preset value.

In an exemplary embodiment of the present disclosure, the operation that the control voltage is detected may include operations as follows. A second voltage regulation value is determined according to the control voltage. A detection voltage is outputted according to the second voltage regulation value and a second voltage. The first level is outputted when the detection voltage is greater than a preset turnover level, and the second level is outputted when the detection voltage is less than the preset turnover level.

The method shown in FIG. 8 may be implemented through a variety of circuits to flexibly regulate the detection threshold of the voltage detection circuit.

It is to be noted that, although a plurality of modules or units of the device for action execution are mentioned in the foregoing detailed descriptions, but this division is not fixed. Actually, according to the implementation modes of the disclosure, the foregoing described features and functions of two or more modules or units may be embodied in one module or unit. On the contrary, the foregoing described features and functions of one module or unit may further be embodied by a plurality of modules or units.

Other implementation solutions of the present disclosure will be apparent to those skilled in the art from consideration of the specification and practice of the present disclosure. This present disclosure is intended to cover any variations, uses, or adaptations of the present disclosure which conform to the general principles thereof and include the common technology known or customary practice in the art which are not disclosed in the present disclosure. The specification and embodiments are considered as exemplary only, and the true scope and concept of the present disclosure are indicated by the claims.

With the voltage detection circuit provided by the embodiments of the present disclosure, the voltage regulation range is determined according to the threshold regulation signal, and the voltage regulation value is determined in the voltage regulation range according to the voltage to be detected, thereby flexibly regulating the detection threshold by detecting the control voltage generated according to the voltage regulation value, and a solution of setting multiple voltage detection thresholds are implemented through a circuit.

What is claimed is:

1. A voltage detection circuit, comprising:
   a threshold setting module having a first input end, a second input end and a power supply end, wherein the first input end is configured to receive a voltage to be detected, the second input end is configured to receive a threshold regulation signal, and the power supply end is connected to a first voltage and is configured to set a voltage regulation range according to the threshold regulation signal, determine a first voltage regulation value in the voltage regulation range according to the voltage to be detected, and generate a control voltage according to the first voltage and the first voltage regulation value; and
   a voltage conversion module, wherein an input end of the voltage conversion module receives the control voltage through a first node, and is configured to output a first level in response to that the control voltage is greater than a preset value, and output a second level in response to that the control voltage is less than or equal to the preset value.

2. The voltage detection circuit of claim 1, further comprising:
   a voltage bias module which is connected to the first node and is configured to provide a bias voltage for the input end of the voltage conversion module.

3. The voltage detection circuit of claim 1, wherein the threshold setting module has a plurality of predetermined voltage regulation ranges, and the threshold regulation signal is used to select one voltage regulation range from the plurality of voltage regulation ranges.

4. The voltage detection circuit of claim 3, wherein the threshold setting module comprises a plurality of threshold setting units and a plurality of control units, each of the control units is connected to one or more of the threshold setting units, and each of the control units is configured to enable one or more of the threshold setting units in response to the threshold regulation signal.

5. The voltage detection circuit of claim 4, wherein the voltage regulation ranges corresponding to the plurality of threshold setting units are identical, or the voltage regulation range of at least one threshold setting unit of the plurality of threshold setting units is different from the voltage regulation ranges of the threshold setting units other than the at least one threshold setting unit of the plurality of threshold setting units.

6. The voltage detection circuit of claim 4, when the number of the control units is greater than one, at least two of the control units are connected to a same threshold setting unit, or different control units are connected to different threshold setting units.

7. The voltage detection circuit of claim 4, wherein each of the control units comprises a switch element, a first end of the switch element is connected to a first end of the threshold setting unit corresponding to the control unit, and a second end of the switch element is connected to a second end of the threshold setting unit corresponding to the control unit.

8. The voltage detection circuit of claim 4, wherein a control end of each of the control units is configured to receive the threshold regulation signal or an inversion signal of the threshold regulation signal, or the threshold regulation signal comprises a plurality of different threshold regulation sub-signals, the control end of each of the control units corresponds to one of the threshold regulation sub-signals, and different control units are connected to a same threshold regulation sub-signal or different threshold regulation sub-signals.

9. The voltage detection circuit of claim 7, wherein a control end of each of the control units is configured to receive the threshold regulation signal or an inversion signal of the threshold regulation signal, or the threshold regulation signal comprises a plurality of different threshold regulation sub-signals, the control end of each of the control units corresponds to one of the threshold regulation sub-signals, and different control units are connected to a same threshold regulation sub-signal or different threshold regulation sub-signals.

10. The voltage detection circuit of claim 4, wherein each of the threshold setting modules comprises a plurality of transistors connected in series, and the threshold setting module comprises:
    M transistors connected in series, wherein gates of the M transistors are all coupled to the first input end; a first end of a first transistor in the M transistors is coupled to the power supply end, the second end of the first transistor is connected to a first end of a second transistor in the M transistors, a second end of a M-th transistor in the M transistors is connected to the first node, and a first end of the M-th transistor is connected to a second end of a (M-1)-th transistor in the M transistors, M being greater than or equal to 2.

11. The voltage detection circuit of claim 7, wherein the switch element is implemented by a transistor.

12. The voltage detection circuit of claim 1, wherein the voltage conversion module comprises:
    a detection unit having a power end, an input end and an output end, wherein the power end is connected to a second voltage, and the input end is connected to the first node, the detection unit is configured to determine a second voltage regulation value according to the control voltage of the first node, and output a detection voltage through the output end according to the second voltage and the second voltage regulation value; and
    a level conversion unit, wherein an input end of the level conversion unit is connected to the output end of the detection unit, and is configured to output the first level or the second level according to the detection voltage.

13. The voltage detection circuit of claim 12, wherein the detection unit comprises:
    a first P-type transistor, wherein a gate of the first P-type transistor, as the input end of the voltage conversion module, is connected to the first node, a source of the first P-type transistor is connected to the power end, and a drain of the first P-type transistor is connected to a second node, and the second node is connected to the input end of the level conversion unit; and
    a first resistance unit, wherein a first end of the first resistance unit is connected to the second node, and the second end is grounded.

14. The voltage detection circuit of claim 12, wherein the level conversion unit comprises an inverter.

15. The voltage detection circuit of claim 13, wherein the level conversion unit comprises an inverter.

16. The voltage detection circuit of claim 2, wherein the voltage bias module comprises:
    a second P-type transistor, wherein a source of the second P-type transistor is connected to a second voltage, and a gate and a drain of the second P-type transistor are connected to the first node; and a second resistance unit, wherein a first end of the second resistance unit is connected to the first node, and a second end of the second resistance unit is grounded.

17. A voltage detection method applied to a voltage detection circuit, comprising:

outputting a threshold regulation signal to set a voltage regulation range;

determining a first voltage regulation value within the voltage regulation range according to a voltage to be detected;

determining a control voltage according to the first voltage regulation value and a first voltage; and detecting the control voltage, outputting a first level in response to that the control voltage is greater than a preset value, and outputting a second level in response to that the control voltage is less than or equal to the preset value.

18. The voltage detection method of claim 17, wherein the detecting the control voltage comprises:

determining a second voltage regulation value according to the control voltage;

outputting a detection voltage according to the second voltage regulation value and the second voltage; and outputting the first level in response to that the detection voltage is greater than a preset turnover level, and outputting the second level in response to that the detection voltage is less than the preset turnover level.

* * * * *